United States Patent
Sakamoto et al.

(10) Patent No.: US 7,179,334 B2
(45) Date of Patent: Feb. 20, 2007

(54) SYSTEM AND METHOD FOR PERFORMING SEMICONDUCTOR PROCESSING ON SUBSTRATE BEING PROCESSED

(75) Inventors: Koichi Sakamoto, Tsukui-gun (JP); Yamato Tonegawa, Nirasaki (JP); Takehiko Fujita, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 10/484,709

(22) PCT Filed: Mar. 19, 2002

(86) PCT No.: PCT/JP02/02598

§ 371 (c)(1),
(2), (4) Date: Jan. 26, 2004

(87) PCT Pub. No.: WO03/012848

PCT Pub. Date: Feb. 13, 2003

(65) Prior Publication Data

US 2004/0159284 A1   Aug. 19, 2004

(30) Foreign Application Priority Data

Jul. 26, 2001   (JP) .............................. 2001-225781

(51) Int. Cl.
- *C23C 16/52* (2006.01)
- *C23C 16/44* (2006.01)
- *B65H 1/00* (2006.01)
- *H01L 21/306* (2006.01)
- *C23F 1/00* (2006.01)

(52) U.S. Cl. ............... 118/668; 118/663; 118/669; 118/688; 156/345.24; 414/222.01; 414/222.02; 414/935; 414/936

(58) Field of Classification Search ........ 118/663–681, 118/688–691; 414/935–941, 222.01, 222.02; 156/345.24
See application file for complete search history.

(56) References Cited

U.S. PATENT DOCUMENTS 4,464,451 A * 8/1984 Shirai et al. .................. 430/65

(Continued)

FOREIGN PATENT DOCUMENTS

JP   5-275343   10/1993

(Continued)

OTHER PUBLICATIONS

Machine Translation for JP 07056611 A.*

*Primary Examiner*—Rudy Zervigon
(74) *Attorney, Agent, or Firm*—Oblon, Spivak, McClelland, Maier, Neustadt, P.C.

(57) ABSTRACT

A semiconductor process system (10) includes a measuring section (40), an information processing section (51), and a control section (52). The measuring section (40) measures a characteristic of a test target film formed on a target substrate (W) by a semiconductor process. The information processing section (51) calculates a positional correction amount of the target substrate (W) necessary for improving planar uniformity of the characteristic, based on values of the characteristic measured by the measuring section (40) at a plurality of positions on the test target film. The control section (52) controls a drive section (30A, 32A) of a transfer device (30), based on the positional correction amount, when the transfer device (30) transfers a next target substrate (W) to the support member (17) to perform the semiconductor process.

11 Claims, 5 Drawing Sheets

U.S. PATENT DOCUMENTS

| | | | | |
|---|---|---|---|---|
| 4,770,590 | A * | 9/1988 | Hugues et al. | 414/172 |
| 4,819,167 | A * | 4/1989 | Cheng et al. | 700/59 |
| 4,858,556 | A * | 8/1989 | Siebert | 118/664 |
| 5,001,327 | A * | 3/1991 | Hirasawa et al. | 219/390 |
| 5,030,057 | A * | 7/1991 | Nishi et al. | 414/780 |
| 5,200,021 | A * | 4/1993 | Kawai et al. | 117/86 |
| 5,277,579 | A * | 1/1994 | Takanabe | 432/5 |
| 5,303,671 | A * | 4/1994 | Kondo et al. | 118/719 |
| 5,310,339 | A * | 5/1994 | Ushikawa | 432/253 |
| 5,383,984 | A * | 1/1995 | Shimada et al. | 156/345.26 |
| 5,462,397 | A * | 10/1995 | Iwabuchi | 414/217 |
| 5,540,098 | A * | 7/1996 | Ohsawa | 73/629 |
| 5,563,798 | A * | 10/1996 | Berken et al. | 700/218 |
| 5,616,264 | A * | 4/1997 | Nishi et al. | 219/494 |
| 5,622,639 | A * | 4/1997 | Kitayama et al. | 219/390 |
| 5,671,054 | A * | 9/1997 | Iwasaki | 356/631 |
| 6,066,210 | A * | 5/2000 | Yonemitsu et al. | 118/719 |
| 6,143,083 | A * | 11/2000 | Yonemitsu et al. | 118/719 |
| 6,306,764 | B1 * | 10/2001 | Kato et al. | 438/660 |
| 6,329,643 | B1 * | 12/2001 | Suzuki et al. | 219/497 |
| 6,331,890 | B1 * | 12/2001 | Marumo et al. | 356/369 |
| 6,425,722 | B1 * | 7/2002 | Ueda et al. | 414/217 |
| 6,495,805 | B2 * | 12/2002 | Sakamoto et al. | 219/483 |
| 6,610,968 | B1 * | 8/2003 | Shajii et al. | 219/497 |
| 6,638,860 | B2 * | 10/2003 | Matsunaga et al. | 438/684 |
| 6,875,306 | B2 * | 4/2005 | Tamura | 156/345.24 |
| 6,880,264 | B2 * | 4/2005 | Kato et al. | 34/406 |
| 6,886,272 | B2 * | 5/2005 | Kato et al. | 34/92 |
| 2006/0054088 | A1 * | 3/2006 | Jagawa et al. | 118/715 |

FOREIGN PATENT DOCUMENTS

| | | |
|---|---|---|
| JP | 07056611 A * | 3/1995 |
| JP | 10-12707 | 1/1998 |
| JP | 10-303278 | 11/1998 |
| JP | 2001-155998 | 6/2001 |

* cited by examiner

SYSTEM AND METHOD FOR PERFORMING SEMICONDUCTOR PROCESSING ON SUBSTRATE BEING PROCESSED

TECHNICAL FIELD

The present invention relates to a system and method for performing a semiconductor process on a target substrate, such as a semiconductor wafer. The term "semiconductor process" used herein includes processes of various kinds which are performed to manufacture a semiconductor device or a structure having wiring layers, electrodes, and the like to be connected to a semiconductor device, on a target object, such as a semiconductor wafer or an LCD substrate, by forming semiconductor layers, insulating layers, and conductive layers in predetermined patterns on the target object.

BACKGROUND ART

For semiconductor processes, a vertical heat-processing apparatus is known as a processing apparatus of the batch type for performing a heat process, such as oxidation, diffusion, annealing, or film-formation, on a number of semiconductor wafers simultaneously. In the vertical heat-processing apparatus, a number of wafers are arrayed and held at intervals in the vertical direction in a support member called a wafer boat. This support member is loaded into a vertical process chamber. The wafers are heat-processed while being heated by a heating mechanism disposed around the process chamber.

For example, in a film-formation process, a boat with target substrates held therein is accommodated in a reaction tube (process chamber), which is then set to have a predetermined pressure-reduced atmosphere. A predetermined process gas, such as a film-formation gas, is supplied into the reaction tube from below. Further, the reaction tube is heated to a predetermined process temperature by a cylindrical heater disposed therearound. As a consequence, a film is formed on the target substrates.

In general, a film formed on each target substrate by such a film-formation process tends to vary in film thickness between the central portion and peripheral portion. Specifically, for example, the film thickness on the central portion of the target substrate is apt to be smaller than that on the peripheral portion. Thus, it is difficult to process target substrates with high planar uniformity. It seems that the causes of this are as follows.

Specifically, in a vertical heat-processing apparatus as described above, target substrates are heated by a cylindrical heater disposed therearound. At this time, the peripheral portion of each target substrate relatively rapidly increases in temperature, while the central portion slowly increases in temperature. As a consequence, a temperature planar difference occurs on the target substrate. In addition, the target substrates held by the support member are supplied with a film-formation gas from the peripheral portion side of each target substrate. As a consequence, on each target substrate, the film-formation gas is higher in concentration at the peripheral portion, and lower in concentration at the central portion. In other words, a planar variation in film-formation gas concentration exists on the target substrate.

As described above, since the peripheral portion of each target substrate is subjected to a higher temperature and a higher concentration of film-formation gas, the film-formation reaction is more accelerated thereon, resulting in a larger film thickness than at the central portion of the target substrate. This makes it difficult to attain high planar uniformity. The planar uniformity of a characteristic of a target substrate, such as film thickness or film quality, tends to decrease also in, e.g., oxidation or diffusion.

In recent years, as semiconductor devices become smaller, target substrates require a process to be performed thereon with higher planar uniformity. For example, a ±1% or less film thickness tolerance is increasingly been demanded.

An example of current techniques for improving the planar uniformity of film thickness and film quality on a target substrate is a method of performing a heat process while rotating a support member (susceptor or boat) that holds a target substrate in a process chamber. In this case, the geometric center of the target substrate is aligned with the central axis of rotation of the support member, which ensures improvement in the planar uniformity. For this reason, when the target substrate is transferred onto the support member, the target substrate mount position on the support member is optimized. Ideally, a transfer device is controlled such that the center of thickness distribution of a formed film is aligned with the geometric center of the target substrate.

Specifically, for example, a heat process is actually performed on a target substrate, and the thickness of a formed film is measured to obtain information on the film thickness planar distribution on the target substrate. The film thickness distribution information obtained at this time takes the form of, e.g., almost concentric circles, and is highly symmetric relative to the film formation center of the film thickness distribution. Then, on the basis of the film thickness distribution information thus obtained, an operator obtains, by visual observation, a misalignment amount (eccentricity amount) of the film formation center (process center) of the film thickness distribution, relative to the geometric center of the target substrate. Then, the operator sets, by an empirical method, the control section of the transfer device to reduce the obtained misalignment amount. By doing so, a teaching operation is performed to control the operation of the transfer device, so as to optimize the target substrate mount position on the support member. The teaching operation needs to be repeated several times, such as three to five times.

However, the method described above takes a long time, such as about four to five hours, for the teaching operation, including time for measuring the thickness of a film formed on a target substrate. Accordingly, it is difficult to perform a predetermined heat process with high operating efficiency. In addition, positional change of the film formation center of film thickness distribution cannot be uniquely determined by positional correction of the target substrate mount position. Accordingly, it is very difficult to align the film formation center of film thickness distribution with the geometric center of a target substrate. As a consequence, it is difficult to perform a heat process on a target substrate reliably with high planar uniformity.

DISCLOSURE OF INVENTION

An object of the present invention is to improve a teaching operation and thereby to provide a system and method that allows a semiconductor process to be performed on a target substrate with high planar uniformity and high operating efficiency.

According to a first aspect of the present invention, there is provided a system for performing a semiconductor process on a target substrate, the system comprising:

a process chamber configured to accommodate the target substrate;

a support member configured to support the target substrate in the process chamber;

an exhaust section configured to exhaust the process chamber;

a supply section configured to supply a process gas into the process chamber;

a transfer device configured to transfer the target substrate onto the support member;

a drive section configured to drive the transfer device;

a measuring section configured to measure a characteristic of a test target film formed on the target substrate by the semiconductor process;

an information processing section configured to calculate a positional correction amount of the target substrate necessary for improving planar uniformity of the characteristic, based on values of the characteristic measured by the measuring section at a plurality of positions on the test target film; and a control section configured to control the drive section, based on the positional correction amount, when the transfer device transfers a next target substrate to the support member to perform the semiconductor process.

The system may be arranged in a manner such that the information processing section is configured to obtain a process center in the process chamber, based on distribution of the characteristic of the test target film measured by the measuring section, and to calculate the positional correction amount, based on a misalignment amount of a geometric center of the target substrate relative to the process center.

The system may be arranged in another manner such that it further comprises a reference data storing section configured to store reference data that shows a relationship between positional change of the target substrate on the support member and change in the characteristic estimated relative to the positional change, wherein the information processing section is configured to use the reference data and values of the characteristic at a plurality of positions at least on a peripheral portion of the target substrate, so as to calculate the positional correction amount such that a difference in the characteristic is to fall within a required tolerance.

According to a second aspect of the present invention, there is provided a method of performing a semiconductor process on a target substrate, the method comprising the steps of:

causing a transfer device driven by a drive section, to transfer the target substrate onto a support member;

causing a process chamber to accommodate the support member supporting the target substrate, and perform the semiconductor process on the target substrate;

causing a measuring section to measure a characteristic of a test target film formed on the target substrate by the semiconductor process;

causing an information processing section connected to the measuring section to calculate a positional correction amount of the target substrate necessary for improving planar uniformity of the characteristic, based on values of the characteristic measured by the measuring section at a plurality of positions on the test target film; and causing a control section connected to the information processing section to control the drive section, based on the positional correction amount, when the transfer device transfers a next target substrate to the support member to perform the semiconductor process.

BEST MODE FOR CARRYING OUT THE INVENTION

Figure 1:
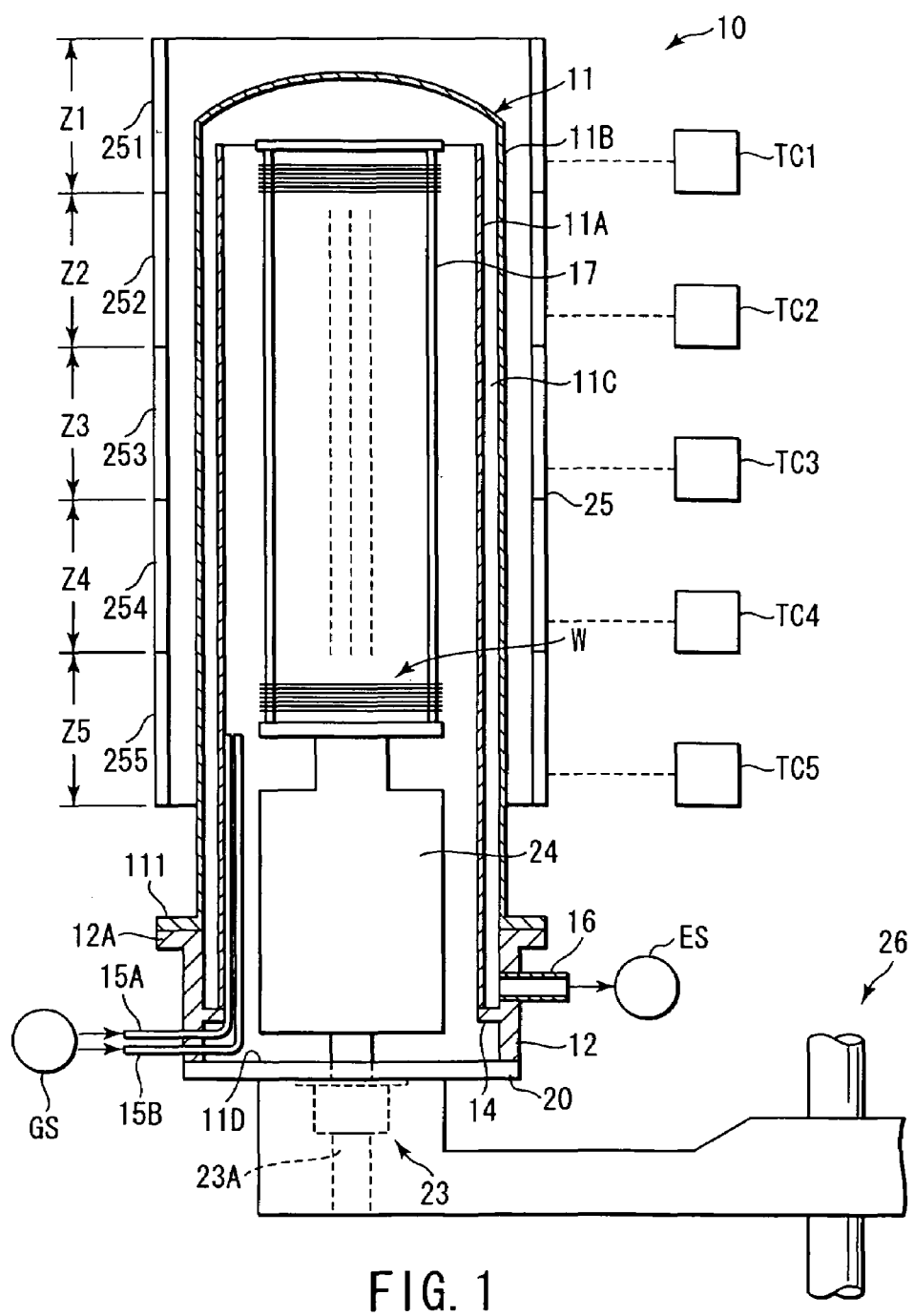
FIG. 1 is a sectional view schematically showing a vertical heat-processing apparatus according to an embodiment of the present invention.

Embodiments of the present invention will be described hereinafter with reference to the accompanying drawings. In the following description, the constituent elements having substantially the same function and arrangement are denoted by the same reference numerals, and a repetitive description will be made only when necessary.

In an embodiment described below, a heat process is taken as an example of a semiconductor process. The heat process includes not only a process of forming various material films on the surface of a target substrate, but also other processes, such as a process of reforming the quality of a formed film. Examples of the heat process are oxidation of oxidizing a silicon surface at a high temperature, thereby forming an oxide film (insulating film); diffusion of heating a silicon layer having an impurity layer on its surface, thereby thermally diffusing the impurity into the silicon layer; and an anneal process used for stabilizing the characteristics or properties. In these processes, a distribution in physical property value or characteristic value, such as film thickness or film quality, is brought about on a target substrate.

Figure 2:
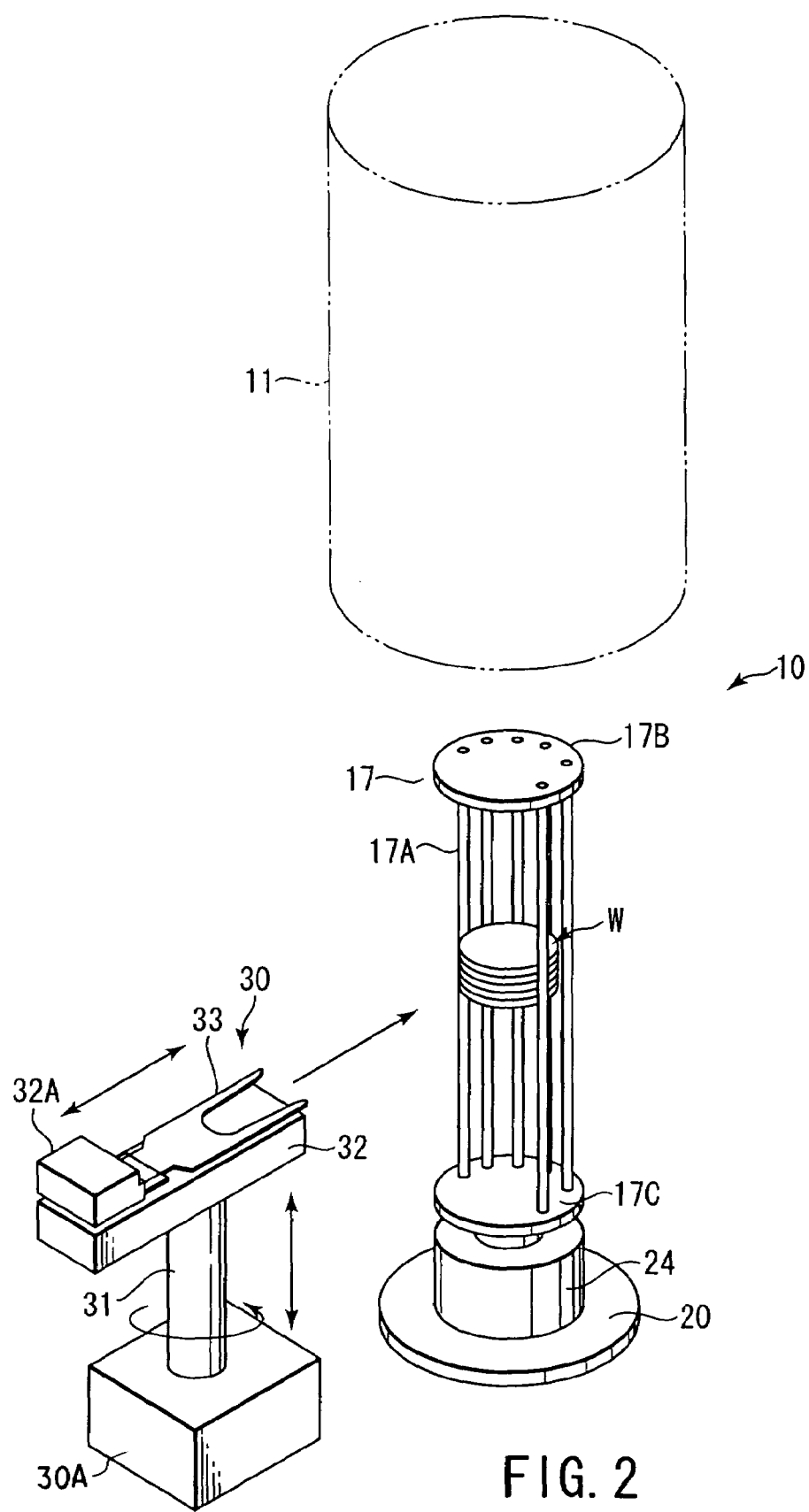
FIG. 2 is a perspective view showing the relationship between a wafer boat unloaded from a reaction tube and a transfer device in the heat-processing apparatus shown in FIG. 1.

FIG. 1 is a sectional view schematically showing a vertical heat-processing apparatus according to an embodiment of the present invention. FIG. 2 is a perspective view showing the relationship between a wafer boat unloaded from a reaction tube and a transfer device in the heat-processing apparatus shown in FIG. 1. This heat-processing apparatus 10 is used for forming a film on a target substrate or semiconductor wafer W by CVD (Chemical Vapor Deposition).

As shown in FIG. 1, the heat-processing apparatus 10 includes a reaction tube (process chamber) 11 disposed to extend upright (in the vertical direction in FIG. 1). The reaction tube 11 has a double-tube structure formed of a straight inner tube 11A with an opened top end, and an outer tube 11B with a closed top end. The outer tube 11B is disposed concentric with the inner tube 11A with a predetermined gap therebetween to form a cylindrical space 11C around the inner tube 11A. The inner tube 11A and outer tube 11B are made of a material having a good heat resistance and corrosion resistance, such as high purity quartz glass.

The bottom of the outer tube 11B of the reaction tube 11 is provided with a short and cylindrical manifold 12 having a flange portion 12A at the top end. A bottom flange portion 111 is formed at the bottom of the outer tube 11B and joined to the flange portion 12A through sealing means (not shown), such as an O-ring. With this arrangement, the outer tube 11B of the reaction tube 11 is airtightly fixed.

The inner tube 11A of the reaction tube 11 extends downward from the bottom of the outer tube 11B into the manifold 12. An annular support portion 14 for the inner tube is formed inside the manifold 12 and supports the bottom of the inner tube 11A.

As shown by the sectional side view of the reaction tube 11, gas supply pipes 15A and 15B are disposed on one side of the manifold 12. The gas supply pipes 15A and 15B airtightly penetrate the sidewall of the manifold 12, and extend upward in the inner tube 11A. The gas supply pipes 15A and 15B are respectively connected to a film-formation gas source and an inactive gas source disposed in a gas source section GS.

An exhaust pipe 16 is disposed on another side of the manifold 12, and communicates with the cylindrical space 11C between the inner tube 11A and outer tube 11B. The exhaust pipe 16 is connected to an exhaust section ES having, e.g., a vacuum pump and a pressure control mechanism. The exhaust section ES is used to exhaust the interior of the reaction tube 11 and set it at a predetermined vacuum pressure.

The bottom port 11D of the reaction tube 11 (an opening of the manifold 12) is opened/closed by a lid body 20, which is like a circular plate. The lid body 20 supports thereon a wafer boat 17 through a heat-insulating cylinder (heat-insulating body) 24. The wafer boat 17 is used as a support member for supporting a number of wafers W. The lid body 20 is attached to a boat elevator 26. The boat elevator 26 moves the lid body 20 up and down, thereby loading/unloading the wafer boat 17 into/from the reaction tube 11. In other words, the boat elevator 26 conveys the wafer boat 17 between a transfer operation position (the position shown in FIG. 2) within a loading area below the reaction tube 11, and a position in the reaction tube 11 (the position shown in FIG. 1).

A rotation drive mechanism 23 is disposed on the bottom of the lid body 20, for rotating the wafers W in horizontal planes by the wafer boat 17. The rotation drive mechanism 23 has a rotation drive shaft 23A, which airtightly penetrates the lid body 20 and is connected to the bottom of the heat-insulating cylinder 24. The wafer boat 17 is detachable from the heat-insulating cylinder 24, but it is unmovable relative to the heat-insulating cylinder 24 in the angular direction.

The wafer boat 17 is made of, e.g., high purity quartz glass. As shown in FIG. 2, for example, the wafer boat 17 includes a top plate 17B, a bottom plate 17C, and struts 17A connecting the plates 17B and 17C. A plurality of grooves are formed on the struts 17A at intervals in the vertical direction, such that they receive the edges of the wafers W to horizontally hold the wafers W. For example, the wafer boat 17 can horizontally support about 100 to 150 wafers W with a gap (pitch) of 5.2 to 20.8 mm therebetween in the vertical direction.

A cylindrical heater 25 is disposed outside the reaction tube 11 to surround the reaction tube 11. The heater 25 heats the wafers W accommodated in the reaction tube 11 through the sidewall of the reaction tube 11. The heater 25 includes linear resistance heating bodies that are disposed in a spiral or meandering manner on the inner surface of a cylindrical heat-insulating body (not shown). The heater 25 is formed of a plurality of, e.g., five, independent heater segments 251 to 255, which are separated from each other in the vertical direction. The heater segments 251 to 255 are supplied with powers independently controlled by heater controllers TC1 to TC5. With this arrangement, a plurality of, e.g., five, heating divisions (zones) Z1 to Z5 are formed in the reaction tube 11, such that they are arrayed in the vertical direction.

For example, the wafers W are subjected to a film-formation process, under process conditions, as follows:

The diameter of semiconductor wafers W is 300 mm;
The process temperature is 540 to 620° C.; and
The process pressure is 13 to 170 Pa (0.1 to 1.3 Torr).

A transfer device 30 is disposed to access the wafer boat 17 lowered to the loading area. The transfer device 30 includes a vertical rotary shaft 31 movable up and down and rotatable, and a long rectangular transfer head 32 fixed to the top of the shaft 31. The transfer head 32 is provided with one to five thin, fork-like support arms 33, movable back and forth in the longitudinal direction of the transfer head 32. The transfer head 32 is driven to move up and down and rotate by a head drive 30A disposed at the bottom of the rotary shaft 31. Each of the support arms 33 is driven to move back and forth by an arm drive 32A disposed on the transfer head 32.

Figure 3:
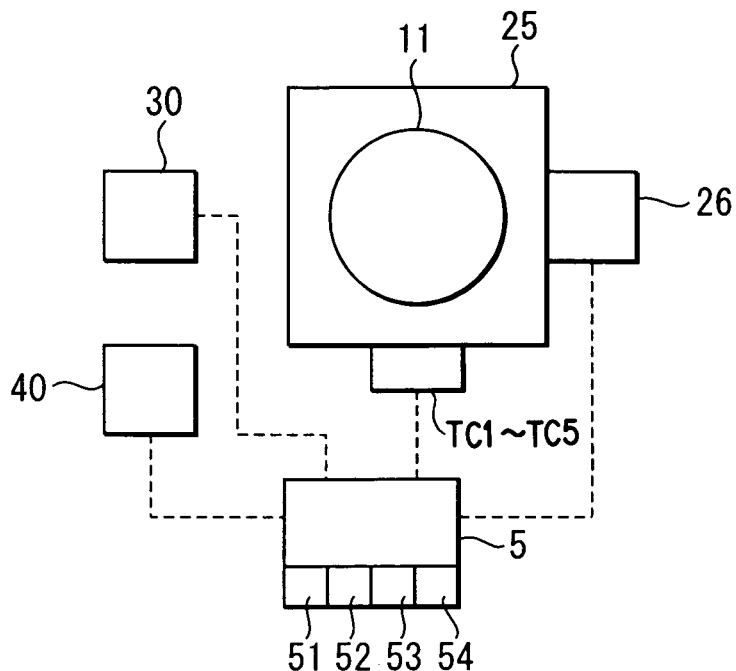
FIG. 3 is a block diagram showing a control system used in the heat-processing apparatus shown in FIG. 1.

FIG. 3 is a block diagram showing a control system used in the heat-processing apparatus 10 shown in FIG. 1. The gas source section GS, exhaust section ES, rotation drive mechanism 23, boat elevator 26, heater controllers TC1 to TC5, and transfer device 30 are operated under the control of a CPU 5. Furthermore, a measuring section for measuring a characteristic of a test target film on a target substrate is further connected to the CPU 5. In this example, the measuring section is a film thickness measuring device 40 for a film formed on a wafer W. The film thickness measuring device 40 is used for performing a teaching operation on the transfer device 30.

Incidentally, as described above, a teaching operation on a transfer device is conceived to teach the transfer device on the basis of data obtained by an already performed process. In this respect, "already performed process" may be a test process or a process for manufacturing actual products. However, hereinafter, a process performed prior to a teaching operation will be referred to as a test process, as needed, for the sake of simplifying the explanation of the present invention. Accordingly, for example, a process performed prior to the first teaching operation is the first test process, and a process performed prior to the second teaching operation is the second test process.

The CPU 5 includes an information processing section 51 and an operation control section 52. As a process in relation to a teaching operation described later, the information processing section 51 calculates a positional correction amount to wafers W necessary for improving the planar uniformity in film thickness, on the basis of film thickness values measured by the measuring device 40. As a process in relation to the teaching operation described later, the control section 52 controls the drives 30A and 32A of the transfer device 30, on the basis of the positional correction amount calculated by the information processing section 51, when the transfer device 30 transfers the next wafers W to the wafer boat 17 to perform a film-formation process.

The CPU 5 further includes a test data storing section 53 and a reference data storing section 54. The test data storing section 53 stores, in time series and as test data, data obtained by the information processing section over a plurality of test processes, as described later. The reference data storing section 54 stores reference data that shows the relationship between positional change of wafers W on the wafer boat 17 and film thickness change estimated relative to the positional change, as described later.

In general, in the heat-processing apparatus 10 shown in FIG. 1, a teaching operation for the transfer device 30 is performed several times, which will be explained later in detail. Prior to each teaching operation, a test process is actually performed on wafers W, and the film thickness of formed films (test target films) is measured by the measuring device 40. Then, on the basis of the film thickness measured by the measuring device 40, a positional correction amount to wafers W necessary for improving the planar uniformity in film thickness is calculated. Then, on the basis of the positional correction amount thus calculated, the transfer device 30 is controlled, when the transfer device 30 transfers the next wafers W to the wafer boat 17.

Next, a detailed explanation will be given of a film-formation process and teaching operation, in the heat-processing apparatus 10 shown in FIG. 1.

First, a storage container (wafer cassette) storing a number of semiconductor wafers W therein is transferred to the heat-processing apparatus 10 by a suitable conveyor (not shown). Then, the wafers W are taken out from the storage container by the transfer device 30 (by the transfer head 32 moving in the vertical direction and angular direction, and the support arms 33 moving back and forth). The wafers W thus taken out are sequentially transferred by the transfer device 30 to the wafer boat 17, which is on the lid body 20 lowered to the loading area.

For example, in each of the wafer support levels of the wafer boat 17, the mount position to which a wafer W is transferred is a position where the geometric center of the wafer W is caused to align with the rotational center of the wafer boat 17 to be rotated by the rotation drive mechanism 23. The uppermost and the lowermost support levels of the wafer boat 17 support, e.g., imitation semiconductor wafers (dummy wafers) placed thereon.

The lid body 20 is moved upward by the elevator mechanism, so that the wafer boat 17 is loaded into the reaction tube 11 through the bottom port 11D of the reaction tube 11, which is then airtightly closed by the lid body 20. Then, the exhaust section ES is operated to reduce the pressure within the reaction tube 11 to a predetermined pressure. In addition, the cylindrical heater 25 is operated to heat the heating zones Z1 to Z5 in the reaction tube 11 to an aimed temperature at which the wafers W are processed. In this state, a suitable film-formation gas is supplied through the gas supply pipe 15A into the reaction tube 11, so that a film-formation process is performed on the wafers W.

If the wafers W subjected to the film-formation process show low planar uniformity of films formed on their surfaces, a teaching operation is required to optimize the mount position set for wafers W on the wafer boat 17 (the mount position set for target substrates in the transfer device 30). In order to perform a teaching operation, for example, the heat-processing apparatus shown in FIG. 1 employs the following steps (1) to (3).

(1) A step of obtaining film thickness distribution information:

In a state where wafers W are placed at the set mount position on the respective support levels of the wafer boat 17, a film-formation process (test process) is performed. Then, the film thickness, which is one characteristic, of films formed on the surfaces of the wafers W by the film-formation process is measured to obtain film thickness distribution information.

(2) A step of obtaining positional correction information:

On the basis of the film thickness distribution information, the film-formation state on the surfaces of the wafers W is evaluated. For example, a portion with the maximum or minimum film thickness is found by calculation, and the coordinate position of this portion on the wafers W is assigned as the film formation center (process center). Then, on the basis of information on the eccentricity of the film formation center relative to the geometric center of the wafers W, positional correction information is obtained to correct the set mount position on the support levels.

(3) A step of controlling the transfer device 30:

When the next wafers W are transferred to the wafer boat 17, the operation of the transfer device 30 is controlled to transfer the wafers W to an aimed mount position that has been corrected in accordance with the positional correction information.

Specifically, for example, a film-formation process is actually performed on wafers W, and film thickness is measured at a plurality of portions along an arbitrary measurement line on the surface of each wafer W. The units of actually measured film thickness data obtained at the measurement portions are respectively associated with the coordinate positions of the measurement portions on the wafer W. Then, approximation is made to derive a curved surface having a universal relationship that satisfies the conditions of all the units of actually measured film thickness data, so as to acquire film thickness planar distribution on the wafer W, which is considered as film characteristic distribution information. For example, the film thickness distribution thus acquired is almost concentric and highly symmetric relative to the film formation center of the film thickness distribution.

It should be noted that "making approximation to derive a curved surface having a universal relationship" means an information process as follows.

First, in this approximation, the term "all the units of actually measured data" is used. This implies that, when a characteristic between two measurement points is calculated, units of data on measurement points other than the two measurement points are also involved. If film thickness is used, for example, measurement point data comprises film thickness and coordinate data.

Figure 4A:
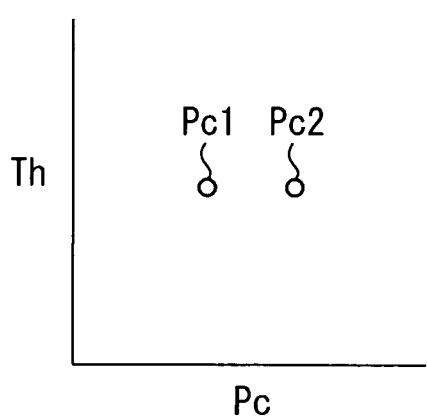
FIGS. 4A and 4B are views for explaining a method of making approximation to derive a curved surface having a universal relationship.
Figure 4B:
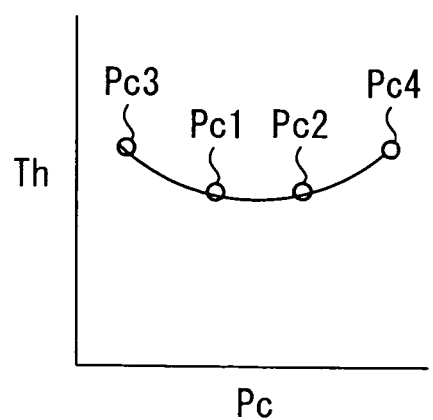

FIGS. 4A and 4B are views for explaining a method of making approximation to derive a curved surface having a universal relationship. In FIGS. 4A and 4B, the horizontal axis denotes the coordinate position Pc, and the vertical axis denotes film thickness Th. As shown in FIG. 4A, when film thickness between two measurement points Pc1 and Pc2 is calculated by interpolation while using data on the two measurement points Pc1 and Pc2, the minimum value is unclear. On the other hand, as shown in FIG. 4B, by referring further to units of data on measurement points Pc3 and Pc4 sandwiching the two measurement points Pc1 and Pc2, it is possible by interpolation to calculate a value approximating to the minimum value of the film thickness between the two measurement points Pc1 and Pc2, which is not acquired in FIG. 4A. That is to say, this process is "making approximation to derive a curved surface having a universal relationship".

However, in practice, interpolation between one measurement point and another measurement point is performed not by using all the units of actually measured data. According to BI-CUBIC method (bi-cubic convolution), which is most popular among the image interpolation methods used in computer graphic or the like, 16 units of film thickness data on the periphery are used along with X-Y coordinates to perform interpolation by a three dimensional function. Software for performing such an interpolation is available in the market.

Figure 5:
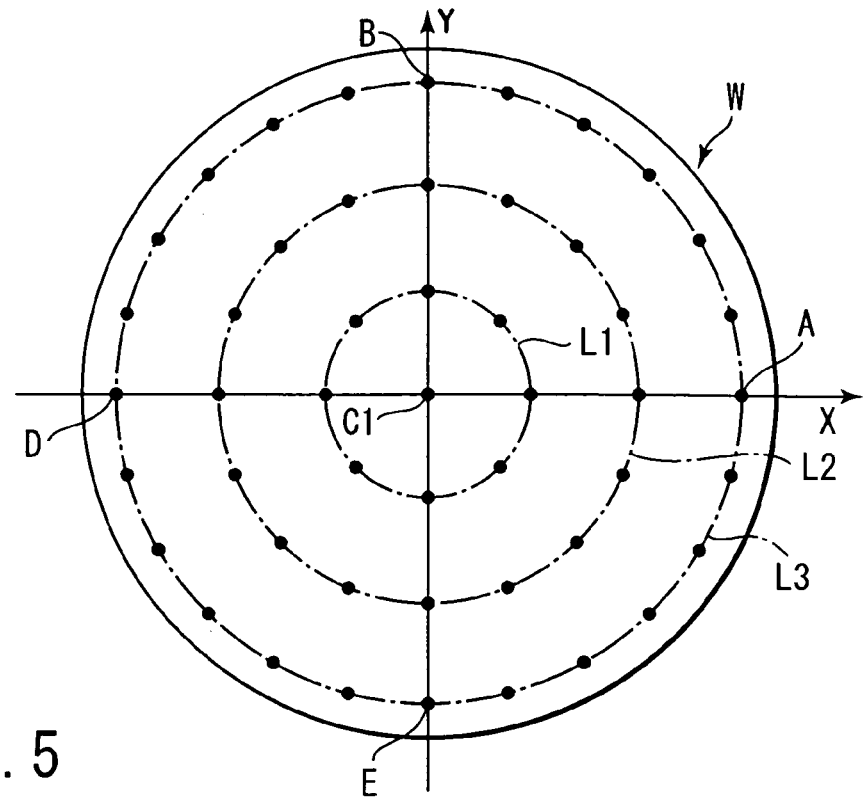
FIG. 5 is a view showing an example of film thickness measurement location on a semiconductor wafer.

The location and number of measurement portions to acquire film thickness distribution are not specifically limited, but may be suitably selected in accordance with the purpose in light of film thickness distribution accuracy and time efficiency. FIG. 5 is a view showing an example of film thickness measurement location on a semiconductor wafer.

In FIG. 5, measurement portions are selected on a plurality of, e.g., three, circular measurement lines L1, L2, and L3, which are disposed equidistant and concentric relative to the geometric center C1 of a wafer W. The measurement portions are disposed equiangular-distant about the geometric center C1 of the wafer W, on the measurement lines L1, L2, and L3. Specifically, for example, film thickness is measured at totally 49 portions, namely, the geometric center C1 of the wafer W, 8 portions on the measurement line L1, 16 portions on the measurement line L2, and 24 portions on the measurement line L3. The measurement portions selected on the measurement line L3 on the peripheral edge side of the wafer W are preferably located at positions, e.g., about 3-mm distant inwardly from the peripheral edge of the wafer W.

The coordinate position on the wafer W is defined by, e.g., "X axis" and "Y axis". The "Y axis" extends in the reciprocation direction of the support arm 33 of the transfer device 30 in which the support arm 33 moves back and forth relative to the central axis of rotation of the wafer boat 17 (the vertical direction in FIG. 5). The "X axis" extends in a direction perpendicular to the "Y axis" on the surface of the wafer W (the horizontal direction in FIG. 5).

As described above, it is preferable to acquire a film thickness distribution that satisfies conditions of all the units of actually measured film thickness data and estimated film thickness data. For this purpose, the information processing section 51 of CPU 5 performs two-dimensional data interpolation on the basis of given measurement data (on the X coordinate, Y coordinate, and film thickness). This interpolation method may be a linear interpolation method, least square method, cubic interpolation method, or the like.

The minimum or maximum film thickness is found from the interpolated data, and its coordinates are used as the central coordinates. The coordinates may be obtained by forming a mathematical expression representing the curved surface, and calculating the minimum value or maximum value therefrom by differentiation. However, when a computer is used to calculate the minimum value or maximum value, it is necessary to set some conditions such that measurement data on portions having a film thickness varied by outer disturbance, e.g., near the struts of the boat, is removed in advance, or excluded from candidates for the minimum value or maximum values.

Specifically, for example, a least square method is used to interpolate film thickness data on an estimation portion between measurement portions adjacent to each other on the measurement lines L1 to L3, so as to form estimated film thickness data that satisfies the relationship relative to the actually measured data. Then, it is performed to acquire a film thickness distribution that satisfies conditions of all the units of actually measured film thickness data and estimated film thickness data. By doing so, the film thickness planar distribution on a wafer W can be acquire with high reliability. Accordingly, a positional correction amount to correct the set mount position on the wafer boat 17 can be set with high reliability. Furthermore, since the number of measurement portions where film thickness measurement is actually performed can be small, the time efficiency is improved.

Figure 6:
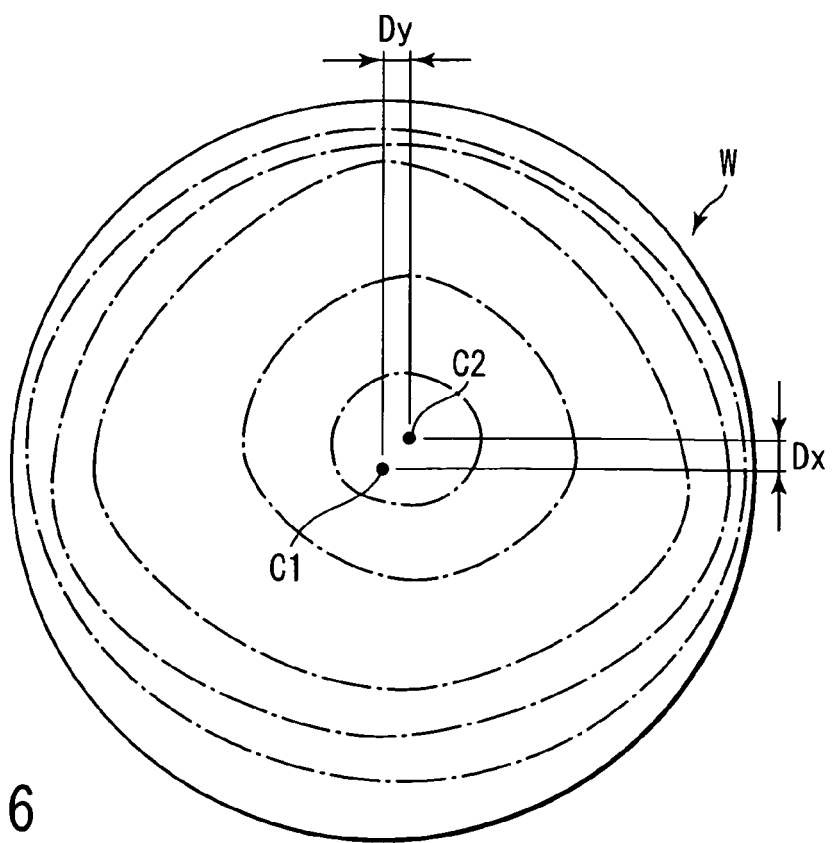
FIG. 6 is a view for explaining a film-formation state (film thickness distribution) on a semiconductor wafer.

FIG. 6 is a view for explaining a film-formation state (film thickness distribution) on a semiconductor wafer. Specifically, the tendency of the acquired film thickness distribution is recognized, such that it is a "convex type" where the film thickness is larger at the central portion of the wafer W than the peripheral portion, or it is a "concave type" where the film thickness is larger at the peripheral portion of the wafer W than the central portion. As shown in FIG. 6, the coordinate position on the wafer W where the film thickness is minimum or maximum in the film thickness distribution (which will be referred to as a "specific coordinate position") is selected as the film formation center (process center) C2 of the film thickness distribution. Then, a misalignment amount Dx in the X axis direction and a misalignment amount Dy in the Y axis direction are obtained, of the specific coordinate position C2 relative to the geometric center C1 of the wafer W. On the basis of the misalignment amounts Dx and Dy thus obtained, a positional correction amount to correct the set mount position on the wafer boat 17 is calculated.

When the "specific coordinate position C2" is selected, there may be a plurality of coordinate positions where the film thickness is maximum or minimum. In this case, the central position of almost circular lines showing film thickness contour, where the film thickness is within a predetermined range, can be selected as the specific coordinate position.

The positional correction amounts in the X axis direction and Y axis direction thus obtained are used to correct the set mount position on the support levels of the wafer boat 17, thereby setting a new aimed mount position. When the next wafers W to be subjected to the same film-formation process are transferred to the wafer boat 17, the operation of the transfer device 30 is controlled to transfer the wafers W to the aimed mount position corrected by the positional correction information. Specifically, in the transfer device 30, the rotation amount of the transfer head 32 and the reciprocation amount of the support arm 33 are controlled.

For example, it is assumed that the first test process provides a specific coordinate position C2 with a misalignment amount Dx in the X axis direction and a misalignment amount Dy in the Y axis direction. In this case, a positional correction amount to correct the set mount position, used in the first teaching operation, is set to correspond to the misalignment amounts Dx and Dy. Then, in accordance with the conditions set in the first teaching operation, the second test process is performed. Then, the result of the second test process is used to calculate a new positional correction amount, and the second teaching operation is performed.

Because, even if the set mount position is corrected with a positional correction amount that is the same as the misalignment amount of the specific coordinate position C2, the misalignment amount does not become essentially zero in most cases in practice. Accordingly, such a test process (or it may be a process for manufacturing actual products, as described previously) and teaching operation are repeated, e.g., three or four times in practice, so that the operation of the transfer device 30 is controlled by feedback.

In the n-th test process, a positional correction amount in the X axis direction and Y axis direction (i.e., a positional correction amount used in the (n−1)-th teaching operation) is set in consideration of the relationship between a positional correction amount used and a misalignment amount obtained in the (n−1)-th test process, and a positional correction amount used and a misalignment amount obtained in the (n−2)-th test process. Specifically, for example, the following two formulas (1) and (2) can be used to set a positional correction amount.

$$Tx_n = Tx_{n-1} - \frac{Dx_{n-1}}{\{(Dx_{n-2} - Dx_{n-1})/(Tx_{n-2} - Tx_{n-1})\}} \quad (1)$$

$$Ty_n = Ty_{n-1} - \frac{Dy_{n-1}}{\{(Dy_{n-2} - Dy_{n-1})/(Ty_{n-2} - Ty_{n-1})\}} \quad (2)$$

In the formulas (1) and (2), $Tx_n$, $Tx_{n-1}$, and $Tx_{n-2}$ denote positional correction amounts in the X axis direction used in the n-th, (n−1)-th, and (n−2)-th test processes, respectively. $Dx_{n-1}$ and $Dx_{n-2}$ denote misalignment amounts in the X axis direction obtained in the (n−1)-th and (n−2)-th test processes, respectively. $Ty_n$, $Ty_{n-1}$, and $Ty_{n-2}$ denote positional correction amounts in the Y axis direction perpendicular to the X axis direction used in the n-th, (n−1)-th, and (n−2)-th test processes, respectively. $Dy_{n-1}$ and $Dy_{n-2}$ denote misalignment amounts in the Y axis direction obtained in the (n−1)-th and (n−2)-th test processes, respectively.

In place of the formulas (1) and (2), the following formulas (1m) and (2m) can be used.

$$Tx_n = \frac{Dx_1}{\{(Dx_{n-2} - Dx_{n-1})/(Tx_{n-2} - Tx_{n-1})\}} \quad (1m)$$

$$Ty_n = \frac{Dy_1}{\{(Dy_{n-2} - Dy_{n-1})/(Ty_{n-2} - Ty_{n-1})\}} \quad (2m)$$

In the formulas (1m) and (2m), $Dx_1$ and $Dy_1$ denote misalignment amounts in the X axis direction and Y axis direction, respectively, obtained in the first test process.

Next, the formulas (1) and (2) will be explained, using specific numeric examples. In this explanation, it is assumed that the coordinate position of the geometric center C1 of a wafer W is identified with (x, y)=(0 mm, 0 mm).

For example, in the first test process, wafers W are transferred to the first set mount position by the transfer device 30, and subjected to a film-formation process. Accordingly, this process is performed while using $(Tx_1, Ty_1)$=(0 mm, 0 mm) as a positional correction amount in the X axis and Y axis directions. A film is formed on each wafer W by this film-formation, and the film thickness thereof is utilized to acquire the film formation center (process center). As a result, a misalignment amount of the center in the X axis and Y axis directions relative to the geometric center C1 of the wafer W is identified with, e.g., $(Dx_1, Dy_1)$=(5 mm, 5 mm).

In this case, on the basis of the result of the first test process, the first teaching operation is performed while using $(Tx_2, Ty_2)$=(−5 mm, −5 mm) as a positional correction amount in the X axis and Y axis directions. Then, the second test process is performed on the basis of setting by the first teaching operation. A film is formed on each wafer W by this film-formation, and the film thickness thereof is utilized to acquire the film formation center (process center). As a result, a misalignment amount of the center in the X axis and Y axis directions relative to the geometric center C1 of the wafer W is identified with, e.g., $(Dx_2, Dy_2)$=(1 mm, 1 mm).

In this case, on the basis of the result of the first and second test processes, the second teaching operation is performed while calculating a positional correction amount in the X axis and Y axis directions in accordance with the formulas (1) and (2), as follows. Then, the third test process is performed on the basis of setting by the second teaching operation. It should be noted that the first to third test processes may be processes for manufacturing actual products, as described previously.

$Tx_3$=−5−1/[{5−1}/{0−(−5)}]=−6.25

$Ty_3$=−5−1/[{5−1}/{0−(−5)}]=−6.25

The following table 1 shows data in the X axis direction obtained in this specific example. The same numeric values are obtained as data in the X axis direction. In table 1, "N" denotes the order of the test processes, "Tx" denotes a positional correction amount in the X axis direction used in a test process at the corresponding time, and "Dx" denotes a misalignment amount in the X axis direction obtained in a specified test process at the corresponding time.

TABLE 1

| N | Tx (mm) | Dx (mm) |
|---|---------|---------|
| 1 | 0       | 5       |
| 2 | −5      | 1       |
| 3 | −6.25   | ?       |

The test processes and teaching operations described above are performed for each of the heating zones Z1 to Z5 of the reaction tube 11. For example, one level is selected from the support levels of the wafer boat 17 for each of the heating zones Z1 to Z5, and the test processes and teaching operations described above are performed on the selected support levels. By doing so, a film-formation process can be performed in a state where the eccentricity of all the wafers W relative to the wafer boat 17 is substantially canceled, i.e., a state where the wafers W are held on the optimum mount position on the respective support levels.

The formulas (1) and (2) described above may be changed by applying a moving average method thereto. The denominators of the formulas (1) and (2) denote "change in misalignment amount per unit positional correction amount" by gain, which is calculated on the basis of the misalignment amounts and positional correction amounts of the two past test processes. In order to calculate this gain, the moving average method uses the average of the total of the all the gains and newly calculated gains in the past test processes. This method causes variation in the gain due to outer disturbance to be less influential.

In place of the moving average method, a weighting average method may be applied. The moving average method treats the past gain and the present gain equally in ratio. However, in practice, utilizing the past gain that much is not preferable. Specifically, a gain calculated in a stage with a large eccentricity amount is rough and less reliable. The weighting average method may be used to solve this problem. In this case, when calculating the average, the ratio of the past gain is set smaller, while the ratio of the present gain is set larger.

In the teaching operation described above, a wafer W having been subjected to a film-formation process is used to acquire information on film thickness planar distribution. The film thickness distribution is then used to obtain the misalignment amount of its specific coordinate position C2 (film formation center) relative to the geometric center C1 of the wafer W. The misalignment amount is then used to calculate a positional correction amount to correct the mount position for the wafer W on the wafer boat 17. In place of this method, a second method may be adopted, as follows. In this method, film thickness is measured at a plurality of portions on the periphery of a wafer W. The actually measured film thickness data thus obtained is used to perform calculation such that the difference in film thickness to be formed at the measurement portions will fall within the required tolerance. With this calculation, a positional correction amount is obtained to correct the mount position for the wafer W.

More specifically, for example, film thickness is measured at four portions A, D, B, and E along the measurement line L3 on the wafer W shown in FIG. 5, which are located symmetric relative to the geometric center C1 of the wafer W. The units of actually measured film thickness data obtained at the measurement portions A, B, D, and E are respectively associated with the coordinate positions of the measurement portions A, B, D, and E on the wafer W.

Then, the film thicknesses at the measurement portion A and measurement portion D are compared with each other to perform calculation such that these film thicknesses become equal to each other, thereby obtaining a positional correction amount in the X axis direction to correct the set mount position. Similarly, the film thicknesses at the measurement portion B and measurement portion E are compared with each other to perform calculation such that these film thicknesses become equal to each other, thereby obtaining a positional correction amount in the Y axis direction to correct the set mount position.

Film thickness may be measured at a larger number of portions on the measurement line L3. Film thickness may be similarly measured on a measurement line disposed between the geometric center C1 of the wafer W and the measurement line L3, such as the measurement line L1 or measurement line L2. In this case, since the number of units of actually measured film thickness data is larger, film thickness planar distribution on the wafer W can be acquired with higher reliability. Accordingly, a positional correction amount to correct the set mount position on the wafer boat 17 can be set with high reliability.

In the case of the second method, a positional correction amount is calculated such that film thickness becomes essentially equal at peripheral portions or near-edge portions. The film thickness planar distribution of a highly uniform film is concentric. Assuming such an ideal film, an explanation will be given of a method of calculating a positional correction amount, with reference to the four measurement portions A, B, D, and E described above.

It is assumed that the first test process uses an initial position (x1, y1), the second test process uses a position (x2, y2), and the coordinate positions of the film thickness measurement portions A, B, D, and E are identified with A(x, y)=(150, 0), B(x, y)=(0, 150), D(x, y)=(−150, 0), and E(x, y)=(0, −150), respectively. Furthermore, the film thickness obtained by the first test process is expressed by (A1, B1, D1, and E1), and the film thickness obtained by the second test process is expressed by (A2, B2, D2, and E2).

In this case, Sensitivity(S)=(A2−A1)/(X2−X1) is satisfied where Sensitivity(S) is a film thickness variation rate per unit shifted length. Since the measurement portions A and D are located symmetric in the X axis direction, Iac=(A1+D1)/2 is satisfied where Iac is the average of the ideal film thickness at measurement portions A and D. Furthermore, ΔA=A1−(A1+D1)/2 is satisfied where ΔA is the difference between Iac and A1. Accordingly, a positional correction amount ΔX in the X axis direction to adjust to Iac can be derived by the following formulas (3). In this case, an aimed mount position X3 in the X axis direction used in the third test process is expressed by X3=X2+ΔX.

$$\Delta X = \Delta A / \text{Sensitivity}(S) \tag{3}$$

The positional correction amounts in the X axis direction and Y axis direction thus obtained are used to correct the set mount position on the support levels of the wafer boat 17, thereby setting a new aimed mount position. When the next wafers W to be subjected to the same film-formation process are transferred to the wafer boat 17, the operation of the transfer device 30 is controlled to transfer the wafers W to the aimed mount position corrected by the positional correction information. Specifically, in the transfer device 30, the rotation amount of the transfer head 32 and the reciprocation amount of the support arm 33 are controlled.

In the case of the second method, since the positional correction amount is calculated to correct a reference mount position, the first teaching operation (or the second test process), for example, requires data concerning a change rate of film thickness estimated relative to the positional correction amount (which will be referred to as "estimated gain"). A positional correction amount is set on the basis of the estimated gain, and in light of a difference in film thickness at measurement portions whose film thicknesses are to be compared. As described above, it is not necessarily certain that a positional correction amount compensates with a constant change in film thickness. Accordingly, the estimated gain is set by empirical estimation in accordance with process conditions or the like, such that a certain level of film thickness change can be expected from a certain level of positional correction amount.

For example, reference data is formed on the basis of past experiments using the same processing apparatus, such that the reference data shows the relationship between positional change of wafers W on the wafer boat 17 and film thickness change estimated relative to the positional change. The data is inputted into the CPU 5 before the second method is performed. Thus, the CPU 5 includes the reference data storing section 54 for storing the reference data (see FIG. 3).

In a teaching operation after the second, an actually measured gain (new reference data) is obtained from an actual positional correction amount and film thickness change in the immediately preceding test process, and a positional correction amount is set on the basis of the actually measured gain. For example, a design may be made such that the actually measured gain is renewed every time a teaching operation is performed, as long as processes are performed under the same process conditions.

In the heat-processing apparatus having the structure described above, information on the history of test processes and teaching operations actually performed is stored along with process conditions, in the control unit. In this case, the history information includes, for example, degrees of change (gains) in misalignment amount or film thickness, relative to positional correction amounts. The process conditions includes, for example, process temperature, aimed film thickness, process gas type, and so forth. When the same process conditions as those in the stored history information are used, the history information is used to conduct so called teaching control for performing teaching operations. This allows the time necessary for the teaching operations to be shorten, thereby performing a predetermined heat process with high operating efficiency when the same process conditions as those in the stored history information are used, for example, after maintenance of the heat-processing apparatus or the like.

History information on test processes and teaching operations to be stored may be renewed to new information every time one operation is performed. Serial information until the mount position is optimized may be stored. History information on degrees of change (gains) in misalignment amount or film thickness, relative to positional correction amounts, differs depending on process conditions or the like. Accordingly, units of history information may be acquired correspondingly to different process conditions, and respectively stored along with the process conditions, i.e., as a database in the control unit. In this case, a unit of history information is suitably selected in accordance with process conditions of a heat process to be performed on wafers, so that the mount position for the wafers W on the wafer boat 17 can be optimized with high operating efficiency.

According to the transfer device control method described above, the operation of the transfer device 30 is feedback-controlled in accordance with the film-formation result of a film-formation process actually performed on wafers W. By doing so, a film to be formed can reliably have film thickness distribution with a specific coordinate position (film formation center) C2 whose misalignment amount relative to the geometric center C1 of the wafer W is smaller than a certain value. As a consequence, the wafers W can be mounted on the wafer boat 17 such that the eccentricity of the heat process relative to the wafers W is substantially canceled.

Furthermore, the teaching operation described above can reliably make the misalignment amount smaller. Accordingly, it is possible to shorten the time necessary for realizing a state where the mount position for wafers W on the wafer boat 17 is optimized, i.e., to reduce the number of test processes and teaching operations to be performed, thereby obtaining high operating efficiency.

According to the heat process method using the heat-processing apparatus described above, a predetermined heat process can be performed on wafers W with high planar uniformity on the wafers W. Since a process gas is essentially uniformly supplied from around the wafers W, the film uniformity is less influenced by process gas concentration difference.

In the heat-processing apparatus described above, the operation of the heating means may be controlled in the following manner to further improve process planar uniformity.

Figure 7:
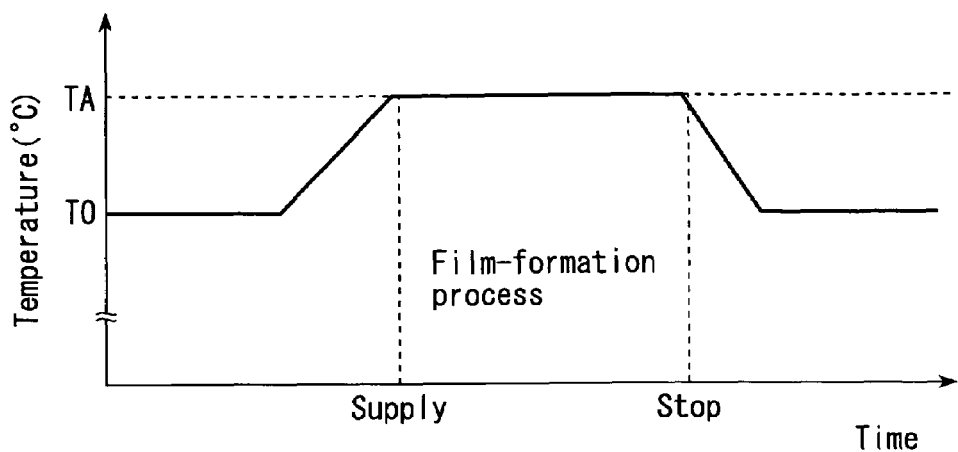
FIG. 7 is a view showing an example of a temperature recipe (temperature profile) used for temperature control on a reaction tube, executed in a film-formation process.

FIG. 7 is a view showing an example of a temperature recipe (temperature profile) used for temperature control on a reaction tube, executed in a film-formation process (including a test process).

As shown in FIG. 7, the wafer boat 17 is loaded into the reaction tube 11, which has been heated to a predetermined temperature T0 [° C.] in advance. Then, the temperature of the heating zones Z1 to Z5 in the reaction tube 11 is heated by the cylindrical heater 25 to a predetermined process temperature TA [° C.]. At this time, the operation of the cylindrical heater 25 is controlled on the basis of a temperature profile preset to keep the temperature of the wafers W essentially constant. Then, for example, the temperature is lowered to the temperature T0 [° C.] used in the pre-heating. A process gas, such as a film-formation gas, is supplied in a state where the temperature of the wafers W is kept essentially constant. In this case, the heating zones Z1 to Z5 may be controlled with the same temperature, or may be independently controlled with different temperatures.

Figure 8:
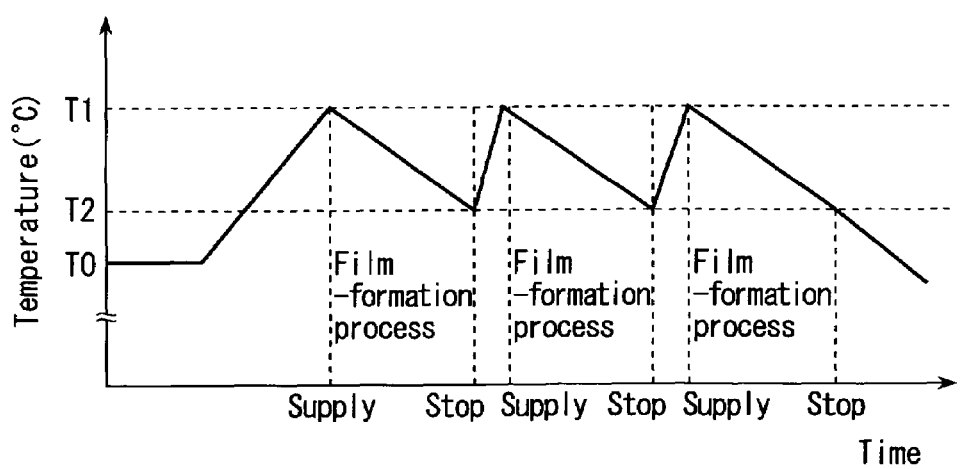
FIG. 8 is a view showing another example of a temperature recipe (temperature profile) used for temperature control on a reaction tube, executed in a film-formation process.

FIG. 8 is a view showing another example of a temperature recipe (temperature profile) used for temperature control on a reaction tube, executed in a film-formation process (including a test process).

As shown in FIG. 8, the wafer boat 17 is loaded into the reaction tube 11, which has been heated to a predetermined temperature T0 [° C.] in advance. Then, the temperature of the heating zones Z1 to Z5 in the reaction tube 11 is once heated by the cylindrical heater 25 to a first process temperature T1 [° C.]. Then, temperature control (which may be referred to as "up-and-down temperature control" hereinafter) is performed such that increase and decrease in temperature are repeated in a temperature range between the first process temperature T1 and a second process temperature T2 lower than the first process temperature T1.

In the case of the temperature recipe shown in FIG. 8, a film-formation gas is supplied during temperature decrease in which the temperature of the heating zones Z1 to Z5 is changed from the first process temperature T1 to the second process temperature T2. On the other hand, the supply of the film-formation gas is stopped during temperature increase in which the temperature of the heating zones is changed from the second process temperature T2 to the first process temperature T1.

When the up-and-down temperature control is performed, the first process temperature T1 is preferably changed to the second process temperature T2 at a temperature increase rate of, e.g., 0.5 to 1° C./min. On the other hand, the second process temperature T2 is preferably changed to the first process temperature T1 at a temperature decrease rate of, e.g., 3 to 8° C./min. The temperature increase rate and temperature decrease rate, however, differ depending on process conditions.

After the film-formation process is performed on the wafers W under the temperature control described above, a teaching operation is performed on the wafers W. By doing so, improvement in planar uniformity on the wafers by the temperature control is added to improvement in planar uniformity on the wafers by the teaching operation. As a consequence, it is possible to obtain higher planar uniformity. Particularly, it is possible to obtain much higher planar uniformity on wafers, when they are processed under process conditions in accordance with the up-and-down temperature control. It seems that the reason of this is as follows.

When wafers W are heated in the reaction tube 11 shown in FIG. 1, they show a temperature characteristic such that the peripheral portion increases and decreases in temperature more rapidly than the central portion. Accordingly, if the heating zones Z1 to Z5 in the reaction tube 11 are once heated to the first process temperature T1 and then lowered to the second process temperature T2, the central portion has a temperature higher than the peripheral portion on the wafers W during the temperature decrease. On the other hand, the peripheral portion has a film-formation gas concentration higher than the central portion on the wafers W in the reaction tube 11. In this case, changes in film thickness respectively due to temperature difference and gas concentration difference are offset with each other, on the central portion and peripheral portion of the wafers. This appears to be the reason why substantially planar film-formation can be achieved for the wafers W.

<Experiment>

A film-formation process was performed on semiconductor wafers, using the heat-processing apparatus shown in FIG. 1, in accordance with each of the following three cases, and a film-formation state obtained thereby was examined. Specifically, (1) no teaching operation was performed; (2) any one of the teaching operations described above was performed; and (3) any one of the teaching operations described above was performed, and the up-and-down temperature control was performed during the film-formation process.

As a consequence, where the film-formation was performed with no teaching operation, the wafers showed a planar uniformity of ±5% relative to an aimed film thickness (in terms of the required tolerance). Where the film-formation was performed with a teaching operation, the wafers showed a planar uniformity of ±3% or less. Where the film-formation was performed under process conditions in which a teaching operation was accompanied with the up-and-down temperature control, the wafers showed a planar uniformity of ±1% or less.

Specifically, in this experiment, the teaching operation was performed in accordance with the following conditions and courses.

Semiconductor wafers having a diameter of 300 mm were mounted on the set mount position on support levels of the wafer boat without performing any teaching operation, and a film-formation process was performed on the wafers in this state. The film-formation state thus obtained on the surfaces of the wafers showed a planar uniformity of ±5% in film thickness relative to an aimed film thickness.

In the next case, the film-formation process was performed after one teaching operation. The film-formation state thus obtained on the surfaces of the wafers showed a planar uniformity of ±4% relative to the aimed film thickness. Then, the film-formation process was performed after two teaching operations. The film-formation state thus obtained on the surfaces of the wafers showed a planar uniformity of ±3.5% relative to the aimed film thickness.

Furthermore, the film-formation process was performed after three teaching operations. The film-formation state thus obtained on the surfaces of the wafers showed a planar uniformity within the required tolerance relative to the aimed film thickness, and improvement in operating efficiency by about 50% was confirmed, as compared to the conventional method. In other wards, for example, it was confirmed that an operation requiring two hours by the conventional method could be completed by one hour.

In the above description, the present invention has been explained with reference to embodiments. The present invention is not limited to these embodiments, but may be variously modified as follows.

For example, the present invention may be applied to a semiconductor process other than a film-formation process by a CVD method. One example thereof is oxidation of oxidizing a silicon surface at a high temperature, thereby forming an oxide film (insulating film). Another example thereof is diffusion of heating a silicon layer having an impurity layer on its surface, thereby thermally diffusing the impurity into the silicon layer.

Where diffusion is performed on a target substrate, information on impurity concentration ratio distribution in a silicon layer (or film thickness distribution information) is acquired. This information is considered as film characteristic distribution information. Then, this distribution information is used to set a specific coordinate position on the target substrate. Then, positional correction information is acquired to correct the target substrate mount position on the support member, similarly to the case where positional correction information is acquired from film thickness distribution information.

A target substrate to be processed in the present invention is not limited to a semiconductor wafer, but may be another target substrate, such as a glass wafer.

The invention claimed is:

1. A system for performing a semiconductor process on a target substrate, the system comprising:
    a process chamber configured to accommodate the target substrate;
    a support member configured to support the target substrate in the process chamber;
    an exhaust section configured to exhaust the process chamber;
    a supply section configured to supply a process gas into the process chamber;
    a transfer device configured to transfer the target substrate onto the support member;
    a drive section configured to drive the transfer device;
    a measuring section configured to measure a characteristic of a test target film formed on the target substrate by the semiconductor process; and
    a processor in communication with the drive section and the measuring section, and including,
    an information processing section configured to calculate a positional correction amount of the target substrate necessary for improving planar uniformity of the characteristic, based on values of the characteristic measured by the measuring section at a plurality of positions on the test target film, wherein the positional correction amount is directed to a horizontal coordinate position at which the target substrate is supported on the support member, and
    a transfer control section configured to control the drive section, based on the positional correction amount, when the transfer device transfers a next target substrate to the support member to perform the semiconductor process, such that said drive section is configured to place the next target substrate is placed on the support member at a horizontal coordinate position corrected in accordance with the positional correction amount,
    wherein the information processing section is configured to obtain a process center in the process chamber, based on distribution of the characteristic on a first target substrate that has been subjected to the semiconductor process at a first horizontal placement position on the support member, and to calculate the positional correction amount, based on a misalignment amount of a geometric center of the first target substrate relative to the process center, and
    wherein the transfer control section is configured to control the drive section to place a second target substrate subsequent to the first target substrate by the transfer device at a second horizontal placement position on the support member which is displaced relative to the first horizontal placement position by the positional correction amount, when the second target substrate subsequent is subjected to the semiconductor process.

2. The system according to claim 1, wherein the semiconductor process is a film-formation process, and the characteristic is film thickness or film quality of a film formed on the target substrate.

3. The system according to claim 1, further comprising a test data storing section configured to store, in time series and as test data, data obtained by the information processing section over a plurality of test processes,
    wherein the information processing section is configured to use data of (n−1)-th and (n−2)-th test processes to calculate the positional correction amount, which is used in an n-th test process.

4. The system according to claim 1, wherein the information processing section is configured to perform an interpolation process, in terms of the characteristic of the test target film, of using actually measured values at positions measured by the measuring section in order to form an estimated value at a position with no measurement by the measuring section, and the information processing section is configured to calculate the positional correction amount, based on the actually measured values and the estimated value.

5. The system according to claim 1, further comprising a rotary member configured to rotate the support member during the semiconductor process.

6. The system according to claim 1, wherein the support member comprises a boat configured to support a plurality of target substrates belonging to a group of substrates having substantially the same contour size, with a gap therebetween in the vertical direction, the system comprises a boat conveyor mechanism configured to covey the boat
the system comprises a boat conveyor mechanism configured to covey the boat between a transfer operation position outside the process chamber and a position inside the process chamber, and
the transfer device is configured to transfer the plurality of target substrates onto the boat placed at the transfer operation position.

7. The system according to claim 1, further comprising a test data storing section configured to store, in time series and as test data, data obtained by the information processing section over a plurality of test processes, wherein the information processing section is configured to substitute a positional correction amount used and a misalignment amount obtained in (n−1)-th and (n−2)-th test processes into a formula to calculate the positional correction amount, which is used in an n-th test process.

8. The system according to claim 7, wherein the information processing section is arranged such that the test formula is configured to calculate the positional correction amount by the following formula comprises $$Tx_n = Tx_{n-1} - \frac{Dx_{n-1}}{\{(Dx_{n-2} - Dx_{n-1})/(Tx_{n-2} - Tx_{n-1})\}}$$

$$Ty_n = Ty_{n-1} - \frac{Dy_{n-1}}{\{(Dy_{n-2} - Dy_{n-1})/(Ty_{n-2} - Ty_{n-1})\}}$$

where $Tx_n$, $Tx_{n-1}$, and $Tx_{n-1}$ denote positional correction amounts in an X axis direction used in the n-th, (n−1)-th, and (n−2)-th test processes, respectively; $Dx_{n-1}$ and $Dx_{-2}$ denote misalignment amounts in the X axis direction obtained in the (n−1)-th and (n−2)-th test processes, respectively; $Ty_n$, $Ty_{n-1}$, and $Ty_{n-2}$ denote positional correction amounts in a Y axis direction perpendicular to the X axis direction used in the n-th, (n−1)-th, and (n−2)-th test processes, respectively; and $Dy_{n-1}$ and $Dy_{n-2}$ denote misalignment amounts in the Y axis direction obtained in the (n−1)-th and (n−2)-th test processes, respectively.

9. A system for performing a semiconductor process on a target substrate, the system comprising:

a process chamber configured to accommodate the target substrate;
a support member configured to support the target substrate in the process chamber;
an exhaust section configured to exhaust the process chamber;
a supply section configured to supply a process gas into the process chamber;
a transfer device configured to transfer the target substrate onto the support member;
a drive section configured to drive the transfer device;
a measuring section configured to measure a characteristic of a test target film formed on the target substrate by the semiconductor process; and
a processor in communication with the drive section and the measuring section, and including,
an information processing section configured to calculate a positional correction amount based on a process center in the process chamber for the target substrate necessary for improving planar uniformity of the characteristic based on values of the characteristic measured by the measuring section at a plurality of positions on the test target film,
wherein the positional correction amount is directed to a horizontal coordinate position at which the target substrate is supported on the support member,
a transfer control section configured to control the drive section based on the positional correction amount when the transfer device transfers a next target substrate to the support member to perform the semiconductor process, such that the next target substrate is placed on the support member at a horizontal coordinate position corrected in accordance with the positional correction amount, and
a reference data storing section configured to store reference data that shows a relationship between positional change of the target substrate on the support member and change in the characteristic estimated relative to the positional change,
wherein the information processing section is configured to use the reference data and values of the characteristic at a plurality of positions at least on a peripheral portion of a first target substrate that has been subjected to the semiconductor process at a first horizontal placement position on the support member, so as to calculate the positional correction amount such that a difference in the characteristic is to fall within a required tolerance, and
wherein the transfer control section is configured to control the drive section to place a second target substrate subsequent to the first target substrate by the transfer device at a second horizontal placement position on the support member, which is displaced relative to the fist horizontal placement position by the positional correction amount, when the second target substrate subsequent is subjected to the semiconductor process.

10. The system according to claim 9, wherein the information processing section is configured to use the reference data and values of the characteristic at a plurality of positions on lines extending in first and second directions that pass through a geometric center of the target substrate and cross each other, so as to calculate the positional correction amount such that values of the characteristic become symmetric within a required tolerance relative to the geometric center in the first and second directions.

11. The system according to claim 10, wherein the reference data is renewed, based on data of an (n−1)-th test process, where the positional correction amount is used for an n-th test process.

* * * * *